(12) United States Patent
Sato

(10) Patent No.: US 6,759,788 B2
(45) Date of Patent: Jul. 6, 2004

(54) UNIDIRECTIONAL SURFACE ACOUSTIC WAVE TRANSDUCER

(75) Inventor: Takahiro Sato, Yokohama (JP)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 30 days.

(21) Appl. No.: 10/263,342

(22) Filed: Oct. 3, 2002

(65) Prior Publication Data

US 2003/0067246 A1 Apr. 10, 2003

(30) Foreign Application Priority Data

Oct. 5, 2001 (JP) ........................................ 2001-310598

(51) Int. Cl.[7] .............................................. H03H 9/25
(52) U.S. Cl. ............................. 310/313 B; 310/313 R; 310/313 A; 310/313 D; 333/193
(58) Field of Search .......................... 310/313 R, 313 A, 310/313 B, 313 D; 3333/193

(56) References Cited

U.S. PATENT DOCUMENTS

| | | | | |
|---|---|---|---|---|
| 5,666,091 A | * | 9/1997 | Hikita et al. | ................. 333/193 |
| 5,773,911 A | * | 6/1998 | Tanaka et al. | ........... 310/313 B |
| 5,850,167 A | * | 12/1998 | Abe | ............................ 333/194 |
| 5,905,324 A | | 5/1999 | Shiba et al. | ............. 310/313 B |

FOREIGN PATENT DOCUMENTS

JP 2003-37475 * 2/2003 ............ H03H/9/25

* cited by examiner

*Primary Examiner*—Thomas M. Dougherty
(74) *Attorney, Agent, or Firm*—Lowe Hauptman Gilman & Berner LLP

(57) ABSTRACT

Disclosed is a unidirectional surface acoustic wave transducer for a SAW transversal filter, which uses a piezoelectric substrate made of Lithium Tetraborate ($Li_2B_4O_7$) and has a phase difference ($\Delta\theta$) of approximately 45° between a reflection center and an excitation center, thereby improving its filter characteristics. A curve D1 is obtained by plotting plural points using as X and Y values the values of a relative electrode thickness $H/\lambda(\%)$ and a relative electrode width $M/\lambda$ of a point having the maximum reflection coefficient $|r|$, and then connecting the plural points. A curve D2 is obtained by plotting plural points using as X and Y values the values of a relative electrode thickness $H/\lambda(\%)$ and a relative electrode width $M/\lambda$ of a point of the phase difference ($\Delta\theta$) of 45° between a reflection center and an excitation center, and then connecting the plural points. Therefore, the relative electrode thickness $H/\lambda(\%)$ and the relative electrode width $M/\lambda$ with the excellent filter characteristics are obtained from an intersection point of two curves. Preferably, the values of the relative electrode thickness $H/\lambda(\%)$ and the relative electrode width $M/\lambda$ are in the range of Q shown in FIG. 5.

4 Claims, 5 Drawing Sheets

UNIDIRECTIONAL SURFACE ACOUSTIC WAVE TRANSDUCER

BACKGROUND OF THE INVENTION

1. Field of the Invention

The present invention relates to a unidirectional surface acoustic wave transducer using Lithium Tetraborate ($Li_2B_4O_7$) single crystals for a SAW (Surface Acoustic Wave) transversal filter.

2. Description of the Related Art

Recently, a SAW (Surface Acoustic wave) filter is mainly used in a mobile communication terminal. Particularly, in case of a mobile communication terminal using a CDMA (Code Division Multiple Access) system, the SAW filter is indispensably used as an intermediate frequency (IF) block filter. Further, a newly developed W-CDMA (Wideband CDMA) system requires the SAW filter as its essential device. As is known well, the SAW filters are commonly divided into two types, i.e., a resonator type and a transversal type. Since the linearity of phase is an important factor in the CDMA mobile communication terminal, in order to satisfy this requirement, the SAW transversal filter is mainly used.

As a conventional SAW transversal filter, a structure using a unidirectional surface acoustic wave transducer in the EWC (Electrode Width Control) type employing a piezoelectric substrate made of a crystal is known. (See U.S. Pat. No. 5,905,324) FIG. 2 is a cross-sectional view of this unidirectional surface acoustic wave transducer. The unidirectional surface acoustic wave transducer of FIG. 2 comprises three electrodes, i.e., an electrode finger $Pa^+$, an electrode finger $Pa^-$ and an electrode Pr. The electrode $Pa^+$ is positive and has a width of $\lambda/8$. Herein, $\lambda$ represents a wavelength of the surface acoustic wave. The electrode $Pa^-$ and the electrode Pr are spaced from the electrode $Pa^+$ by distances of respectively $\lambda/4$ and $3\lambda/8$. As shown in FIG. 2, the electrode Pa and the electrode Pr are respectively disposed on each of both sides from the electrode $Pa^+$. Herein, the distance between the electrode $Pa^+$ and the electrode $Pa^-$, or the distance between the electrode $Pa^+$ and the electrode Pr denotes a distance from the center of the electrode $Pa^+$ to the center of the electrode $Pa^-$ or the center of the electrode Pr. The electrode $Pa^-$ and the electrode Pr are negative, and have widths of $\lambda/8$ and $\lambda/4$, respectively. The electrodes $Pa^+$ and the electrode $Pa^-$ are excitation electrodes and the electrode Pr is a reflection electrode. The excitation electrode $Pa^-$ and the reflection electrode Pr may be respectively disposed on opposite sides from the excitation electrode $Pa^+$.

It is known that the piezoelectric substrate is made of Lithium Tetraborate ($Li_2B_4O_7$). Hereinafter, the piezoelectric substrate made of Lithium Tetraborate ($Li_2B_4O_7$) is referred to as a LBO substrate. In case that a cutting angle of the LBO substrate and a propagation direction of the surface acoustic wave on the LBO substrate are (45°, 90°, 90°) by Euler's angle or their equivalent degrees, the LBO substrate has a large electromechanical coupling coefficient $k^2$, thereby being usable in a wide frequency band and having an excellent temperature stability. Therefore, the LBO substrate is suitable to a SAW filter of a W-CDMA type mobile communication terminal.

However, in the SAW transversal filter using a unidirectional surface acoustic wave transducer, in order to satisfy filter characteristics with symmetry on the center frequency, the phase difference ($\Delta\theta$) between a reflection center and an excitation center needs to be 45°. However, since the phase difference ($\Delta\theta$) of the EWC structure using the crystal substrate is approximately 49°, the crystal substrate cannot have good filter characteristics. Further, it will be expected that the LBO substrate has the same problem.

SUMMARY OF THE INVENTION

Therefore, the present invention has been made in view of the above problems, and it is an object of the present invention to provide a unidirectional surface acoustic wave transducer for a SAW transversal filter, which uses a piezoelectric substrate made of Lithium Tetraborate ($Li_2B_4O_7$) and has a phase difference ($\Delta\theta$) of approximately 45°, thereby improving its filter characteristics.

In accordance with one aspect of the present invention, the above and other objects can be accomplished by the provision of a unidirectional surface acoustic wave transducer for propagating surface acoustic waves in one direction, formed on a piezoelectric made of Lithium Tetraborate ($Li_2B_4O_7$) single crystals and comprising metal electrodes mainly made of aluminum (Al) in a designated thickness H, the metal electrodes comprising: a positive first electrode finger having a width of $\lambda/8$ (wherein, $\lambda$ is a wavelength of the surface acoustic wave); a negative second electrode finger having a width of $\lambda/8$, spaced from the first electrode finger at a distance of $\lambda/4$, and formed on a side of the first electrode finger; and a negative third electrode finger having a designated width M, spaced from the first electrode finger at a distance of $3\lambda/8$, and formed on the other side of the first electrode finger, wherein a cutting angle on the piezoelectric substrate and a propagation direction of the surface acoustic wave on the piezoelectric substrate are in the range of 45°±1°, 90°±1°, and 90°±1° by Euler's angle, or in their equivalent range, and a relation between a relative electrode thickness $H/\lambda(\%)$ obtained by dividing the thickness H of the metal electrode by the wavelength $\lambda$ of the surface acoustic wave and a relative electrode finger width $M/\lambda$ obtained by dividing the width M of the third electrode finger by the wavelength $\lambda$ of the surface acoustic wave is defined by the following formula $$M/\lambda = 0.0075 \times (H/\lambda(\%))^2 - 0.0624 \times (H/\lambda(\%)) + 0.3652 \pm 0.02. \qquad \text{Formula (1)}$$

Preferably, the relative electrode thickness $H/\lambda(\%)$ obtained by dividing the thickness H of the metal electrode by the wavelength $\lambda$ of the surface acoustic wave may be in the range of 1% to 2%.

Further, preferably, the relative electrode thickness $H/\lambda$ (%) obtained by dividing the thickness H of the metal electrode by the wavelength $\lambda$ of the surface acoustic wave and the relative electrode finger width $M/\lambda$ obtained by dividing the width M of the third electrode finger by the wavelength $\lambda$ of the surface acoustic wave may be determined by X and Y values of an intersection point between a first curve defined by the formula (1) and a second curve defined by the following formula (2)

$$M/\lambda = -0.0103 \times (H/\lambda(\%))^2 + 0.0653 \times (H/\lambda(\%)) + 0.2141 \pm 0.02. \qquad \text{Formula (2)}$$

In accordance with another aspect of the present invention, there is provided a unidirectional surface acoustic wave transducer for propagating surface acoustic waves in one direction, formed on a piezoelectric made of Lithium Tetraborate ($Li_2B_4O_7$) single crystals and comprising metal electrodes mainly made of aluminum (Al) in a designated thickness H, the metal electrodes comprising: a positive first electrode having a width of $\lambda/8$ (wherein, $\lambda$ is a wavelength of the surface acoustic wave); a negative second electrode finger having a width of λ/8, spaced from the first electrode finger at a distance of λ/4, and formed on a side of the first electrode finger; and a negative third electrode finger having a designated width M, spaced from the first electrode finger at a distance of 3λ/8, and formed on the other side of the first electrode finger, wherein a cutting angle on the piezoelectric substrate and a propagation direction of the surface acoustic wave on the piezoelectric substrate are in the range of 45°±1°, 90°±1°, and 90°±1° by Euler's angle, or in their equivalent range, and a relative electrode thickness H/λ(%) obtained by dividing the thickness H of the metal electrode by the wavelength λ of the surface acoustic wave is in the range of 1% to 2%, and a relative electrode finger width M/λ obtained by dividing the width M of the third electrode finger by the wavelength λ of the surface acoustic wave is in the range of 0.26 to 0.33.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the annexed drawings.

Figure 1:
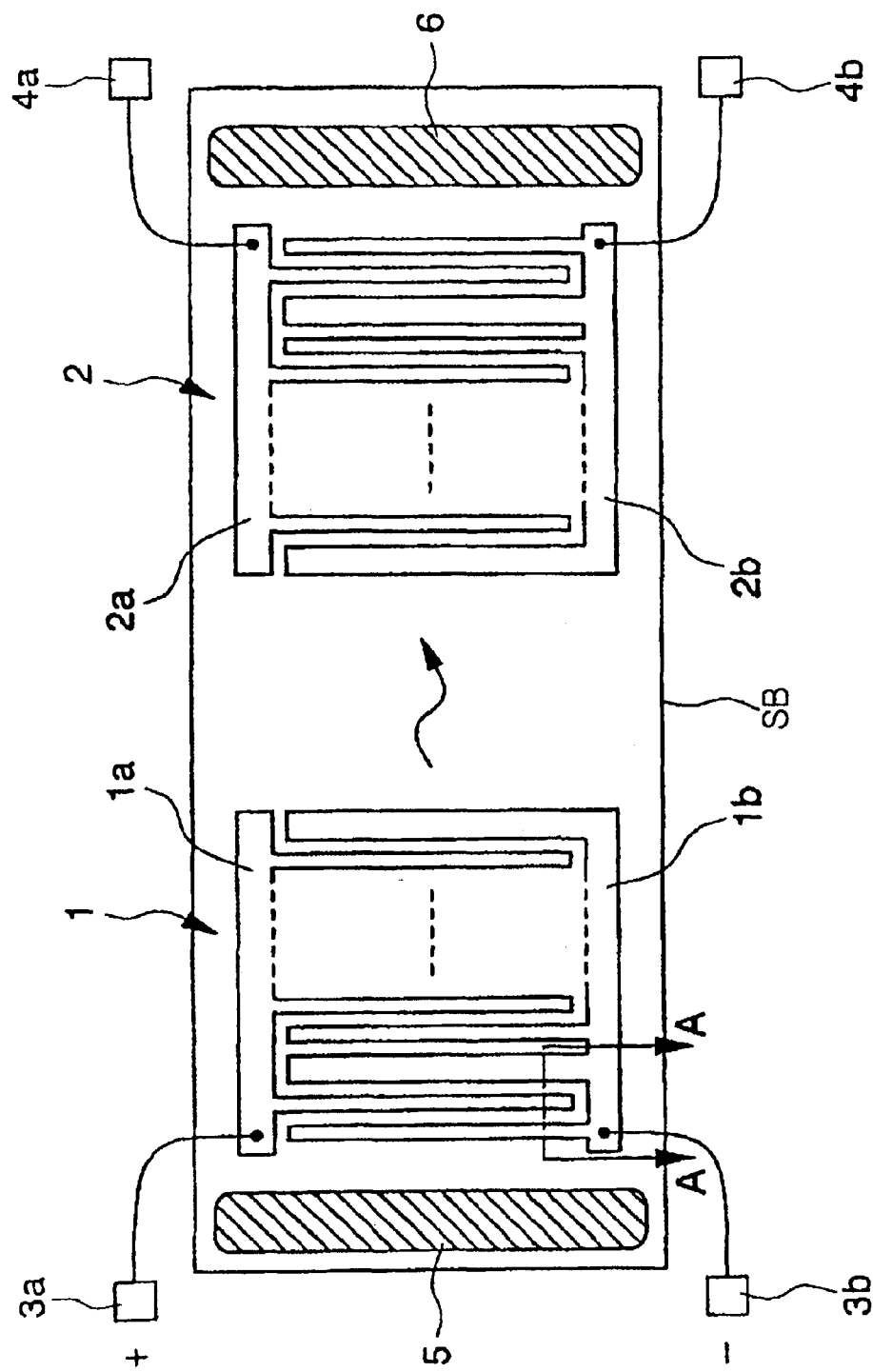
FIG. 1 is a schematic view showing a SAW (Surface Acoustic Wave) transversal filter in accordance with an embodiment of the present invention.
Figure 2:
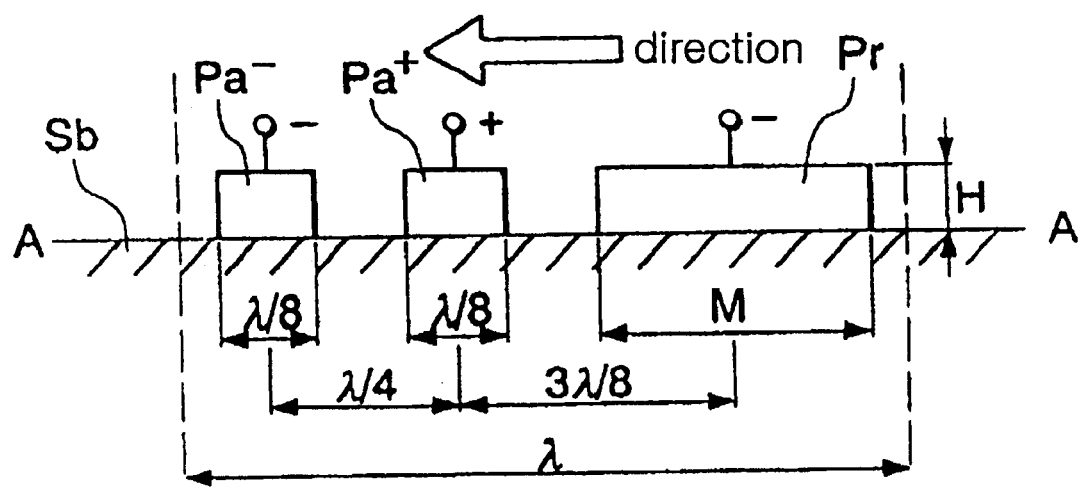
FIG. 2 is an enlarged cross-sectional view of an electrode of the filter of FIG. 1 taken along the line A—A.

FIG. 1 is a schematic view of a SAW (Surface Acoustic Wave) transversal filter in accordance with an embodiment of the present invention, and FIG. 2 is a cross-sectional view of the SAW transversal filter of FIG. 1 taken along the line A—A. In FIGS. 1 and 2, SB represents a piezoelectric substrate made of Lithium Tetraborate ($Li_2B_4O_7$). Hereinafter, the piezoelectric substrate SB made of Lithium Tetraborate ($Li_2B_4O_7$) is referred to as a LBO substrate. An input side transducer 1 and an output side transducer 2 are formed on the LBO substrate SB. The input and output side transducers 1 and 2 are spaced from each other by a designated distance. The input output side transducers 1 and 2 are made of aluminum (Al) or alloy mainly comprising Al. The input side transducer 1 comprises a positive comb type electrode 1a and a negative comb type electrode 1b. The positive comb type electrode 1a is connected to a package terminal 3a, and the negative comb type electrode 1b is connected to a package terminal 3b. Also, the output side transducer 2 comprises a positive comb type electrode 2a and a negative comb type electrode 2b. The positive comb type electrode 2a is connected to a package terminal 4a, and the negative comb type electrode 2b is connected to a package terminal 4b. Further, acoustical absorbents 5 and 6 are respectively formed on left and right sides of the upper surface of the LBO substrate SB.

As shown in FIG. 2, each of the input and output side transducers 1 and 2 comprises an electrode finger $Pa^+$, an electrode finger $Pa^-$ and an reflection electrode finger Pr. The electrode finger $Pa^+$ and the electrode finger $Pa^-$ have a width of λ/8 and a thickness H. The electrode finger $Pa^-$ and the electrode finger Pr are spaced from the electrode finger $Pa^+$ by distances of respectively λ/4 and 3λ/8. The electrode finger $Pa^-$ and the electrode finger Pr are respectively disposed on each of both sides from the electrode finger $Pa^+$. In the case of FIG. 2, the surface acoustic wave is radiated from the transducer in the left direction as indicated by arrow.

Figure 3:
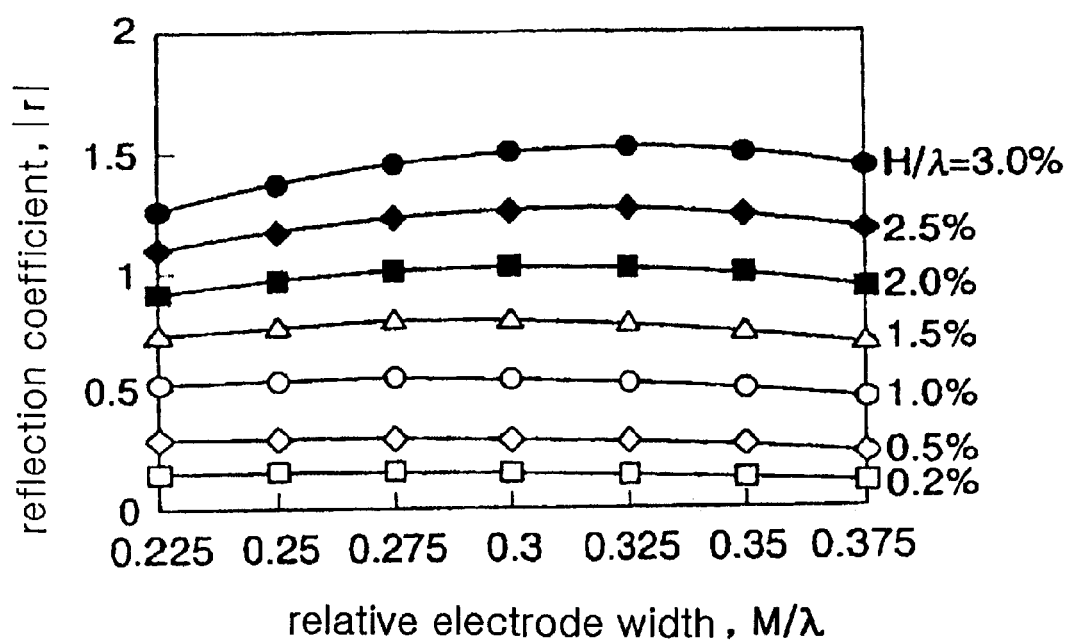
FIG. 3 is a graph showing a relationship between a relative electrode finger width and a reflection coefficient of the filter of FIG. 1.
Figure 4:
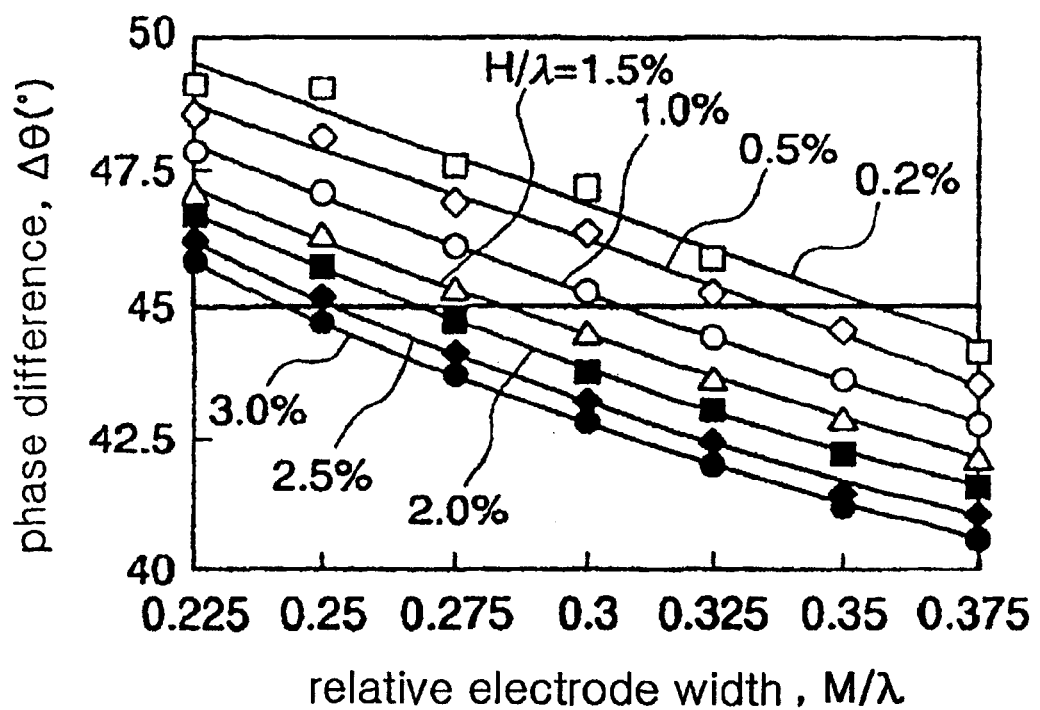
FIG. 4 is a graph showing a relationship between a relative electrode width and a phase difference of the filter of FIG. 1.

Next, the thickness H of the comb type electrode and the width M of the reflection electrode finger Pr will be described in detail. In order to obtain the optimum electrode thickness H and the optimum electrode width M, the present inventors carried out experiments. In these experiments, the filter characteristics were measured after variously modifying the electrode thickness H and the reflection electrode finger width M. FIGS. 3 and 4 are graphs showing these results. FIG. 3 is a graph showing the measured results of a reflection coefficient |r| obtained by variously modifying the electrode thickness H and the electrode width M. In the graph of FIG. 3, a Y-axis represents the reflection coefficient |r| and an X-axis represents a relative electrode width M/λ (without a unit). Seven curves shown in FIG. 3 respectively represent seven cases of a relative electrode thickness H/λ (%) of 0.2%, 0.5%, 1.0%, 1.5%, 2.0%, 2.5%, and 3.0%. Herein, the relative electrode thickness H/λ(%) is a value obtained by dividing a real electrode thickness H by a wavelength λ of a received signal, and the relative electrode width M/λ is a value obtained by dividing a real electrode width M by the wavelength λ of the received signal. The real electrode thickness H and the real electrode width M are required to be modified according to the frequency of the received signal. Therefore, it is important to determine values of the relative electrode thickness and the relative electrode width.

As apparent from FIG. 3, in case that the relative electrode thickness H/λ(%) is constant, the reflection coefficient |r| describes a parabolic curve relative to the relative electrode width M/λ. Further, as the relative electrode thickness H/λ(%) increases, the reflection coefficient |r| increases. It is to be noted that the value of the relative electrode width M/λ representing the maximum reflection coefficient |r| in respect to each relative electrode thickness H/λ(%) increases along with the increases of the relative electrode thickness H/λ(%).

FIG. 4 is a graph showing the measured results of a phase difference (Δθ) obtained by variously modifying the electrode thickness H and the electrode width M. In the graph of FIG. 4, a Y-axis represents the phase difference (Δθ) and an X-axis represents the relative electrode width M/λ (without a unit). Also, seven curves shown in FIG. 4 respectively represent seven cases of the relative electrode thickness H/λ(%) of 0.2%, 0.5%, 1.0%, 1.5%, 2.0%, 2.5%, and 3.0%. As apparent from FIG. 4, in case that the relative electrode thickness H/λ(%) is constant, the phase difference (Δθ) drastically decreases, as the relative electrode width M/λ increases. Further, as the relative electrode thickness H/λ(%) increases, the phase difference (Δθ) decreases. Each curve cuts across a line indicating the optimum phase difference (Δθ) of 45°. Therefore, it will be appreciated that each curve has a value of the relative electrode width M/λ indicating the optimum phase difference (Δθ) of 45°.

Figure 5:
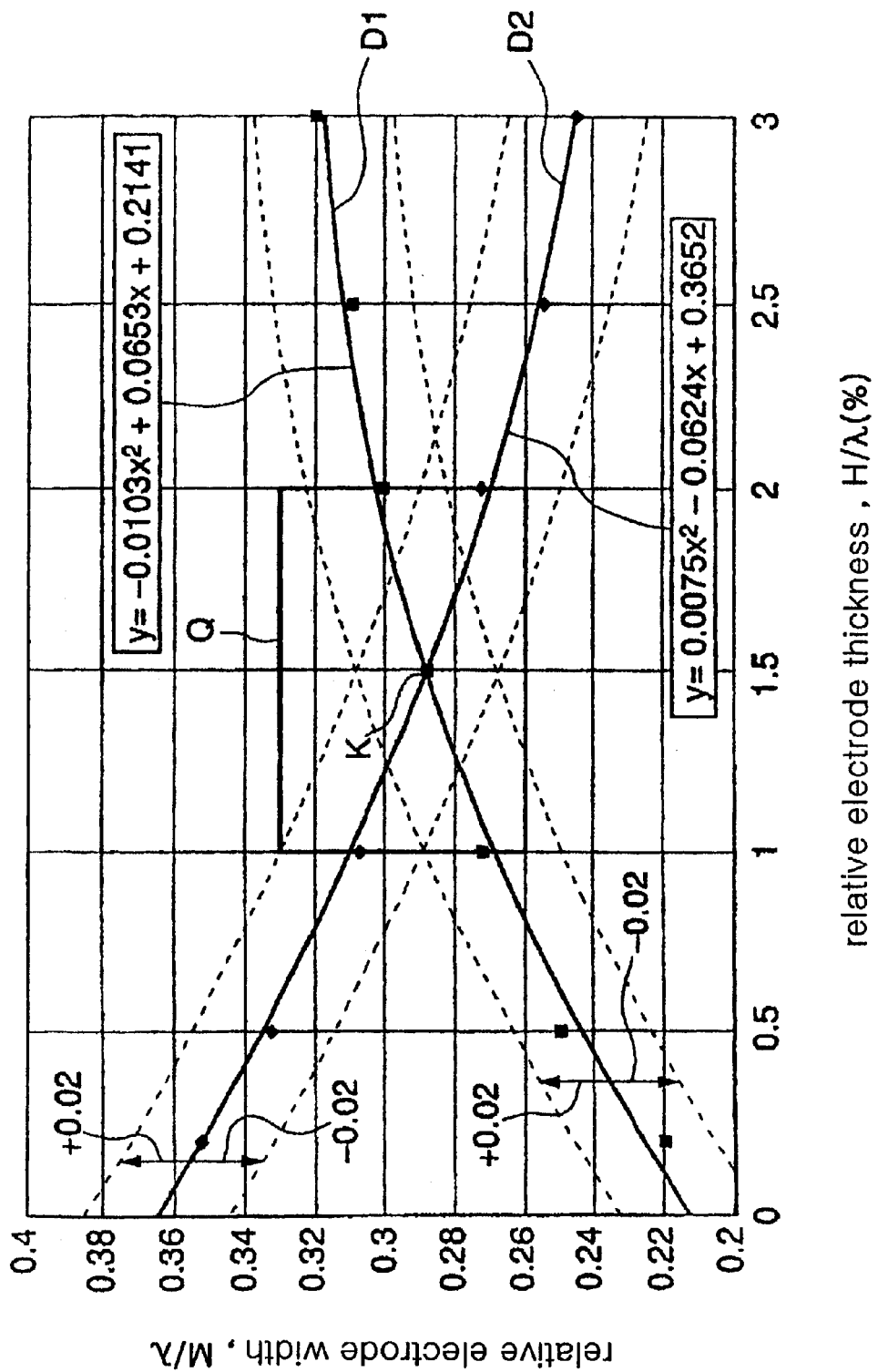
FIG. 5 is a graph showing a relationship between a relative electrode thickness and a relative electrode finger width based on the FIGS. 3 and 4.

FIG. 5 is a graph showing a relationship between a relative electrode thickness H/λ(%) and a relative electrode width M/λ based on the FIGS. 3 and 4. In the graph of FIG. 5, a Y-axis represents the relative electrode width M/λ (without a unit) and an X-axis represents the relative electrode thickness H/λ(%). In FIG. 5, a curve D1 is a curve obtained by plotting plural points and then connecting the points so as to curve-fit. Herein, each point of the curve D1 uses the X and Y values which respectively represent the relative electrode thickness H/λ(%) and the relative electrode width M/λ of the point having the maximum reflection coefficient |r| in each curve having the relative electrode thickness H/λ(%) of 0.2%, 0.5%, 1.0%, 1.5%, 2.0%, 2.5%, and 3.0% in FIG. 3. An equation for obtaining the curve D1 is as follows.

$$M/\lambda = -0.0103 \times (H/\lambda(\%))^2 + 0.0653 \times (H/\lambda(\%)) + 0.2141 \quad \text{Formula (3)}$$

As apparent from FIG. 3, although the relative electrode width M/λ obtained by the formula (3) has a variation in the range of approximately ±0.02, it shows that a sufficiently large reflection coefficient is obtained.

Further, a curve D2 of FIG. 5 is a curve obtained by plotting plural points and then connecting the points so as to curve-fit. Herein, each point of the curve D2 uses the X and Y values which respectively represent the relative electrode thickness H/λ(%) and the relative electrode width M/λ of the point cutting cross the line of the phase difference (Δθ) of 45° in each curve having the relative electrode thickness H/λ(%) of 0.2%, 0.5%, 1.0%, 1.5%, 2.0%, 2.5%, and 3.0% in FIG. 4. An equation for obtaining the curve 21 is as follows.

$$M/\lambda = 0.0075 \times (H/\lambda(\%))^2 - 0.0624 \times (H/\lambda(\%)) + 0.3652 \quad \text{Formula (4)}$$

Although the relative electrode width M/λ obtained by the formula (4) has a variation in the range of approximately ±0.02, as shown in FIG. 4, the phase difference (Δθ) is in the range of 45°±1°. Therefore, the filter characteristic with symmetry on the center frequency can be obtained.

As described above, the curve D2 of FIG. 5 represents the phase difference (Δθ) of 45°. Therefore, if the relative electrode thickness and the relative electrode width are set as the H/λ(%) and M/λ values of a point of the curve D2, the optimum phase difference (Δθ) is obtained. Further, the curve D1 of FIG. 5 represents the maximum reflection coefficient |r|. Therefore, if the relative electrode thickness and the relative electrode width are set as the H/λ(%) and M/λ values of a point of the curve D2, the maximum reflection coefficient |r| is obtained. As a result, the unidirectional surface acoustic wave transducer used for the SAW transversal filter shown in FIGS. 1 and 2 satisfies the ideal filter characteristics by setting X and Y values (H/λ(%)=1.5 (%), M/λ=0.29) of an intersection point K of the curves D1 and D2 as the relative electrode thickness H/λ(%) and the relative electrode width M/λ.

However, due to various limits of the manufacturing process, the electrode thickness H and the relative electrode width M cannot be the aforementioned ideal values. Therefore, substantially, it is preferable to use the values of the relative electrode thickness H/λ(%) and the relative electrode width M/λ in the range of Q shown in FIG. 5. That is, preferably, the relative electrode thickness H/λ(%) is in the range of 1.0%~2.0% and the relative electrode width M/λ is in the range of 0.26~0.33.

Further, a cutting angle on the LBO substrate and a propagation direction of the surface acoustic wave on the LBO substrate may have a variation in the range of approximately 1°. That is, the cutting angle on the LBO substrate and the propagation direction of the surface acoustic wave on the LBO substrate are in the range of (45°±1, 90°±1°, 90°±1) by Euler's angle.

As apparent from the above description, the present invention provides a unidirectional surface acoustic wave transducer for a SAW transversal filter, which uses a piezoelectric substrate made of Lithium Tetraborate ($Li_2B_4O_7$) and has a phase difference (Δθ) of approximately 45° between a reflection center and an excitation center, thereby improving its filter characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A unidirectional surface acoustic wave transducer for propagating surface acoustic waves in one direction, formed on a piezoelectric made of Lithium Tetraborate ($Li_2B_4O_7$) single crystals and comprising comb type metal electrodes mainly made of aluminum (Al) in a designated thickness H, said metal electrodes comprising:

a positive electrode having a plurality of first electrode fingers, each of which having a width of λ/8, where λ represents a wavelength of the surface acoustic wave; and a negative electrode having a plurality of second electrode fingers, each of which having a width of λ/8, spaced from adjacent one of the first electrode fingers at a distance of λ/4, and formed on a side of thereof and a plurality of third electrode fingers, each of which having a designated width M, spaced from adjacent one of the first electrode fingers at a distance of 3λ/8, and formed on the other side thereof, wherein a cutting angle on the piezoelectric substrate and a propagation direction of the surface acoustic wave on the piezoelectric substrate are in the range of 45°±1°, 90°±1°, and 90°±1° by Euler's angle, or in their equivalent range, and a relation between a relative electrode thickness H/λ(%) obtained by dividing the thickness H of the metal electrodes by the wavelength λ of the surface acoustic wave and a relative electrode finger width M/λ obtained by dividing the width M of the third electrode fingers by the wavelength λ of the surface acoustic wave is defined by the following formula $$M/\lambda = 0.0075 \times (H/\lambda(\%))^2 - 0.0624 \times (H/\lambda(\%)) + 0.3652 \pm 0.02. \quad \text{Formula (1)}$$

2. The unidirectional surface acoustic wave transducer as set forth in claim 1, wherein the relative electrode thickness H/λ(%) obtained by dividing the thickness H of the metal electrodes by the wavelength λ of the surface acoustic wave is in the range of 1% to 2%.

3. The unidirectional surface acoustic wave transducer as set forth in claim 1, wherein the relative electrode thickness H/λ(%) obtained by dividing the thickness H of the metal electrodes by the wavelength λ of the surface acoustic wave and the relative electrode finger width M/λ obtained by dividing the width M of the third electrode fingers by the wavelength λ of the surface acoustic wave are determined by H/λ(%) and M/λ values of an intersection point between a first curve defined by the formula (1) and a second curve defined by the following formula (2)

$$M/\lambda = -0.0103 \times (H/\lambda(\%))^2 + 0.0653 \times (H/\lambda(\%)) + 0.2141 \pm 0.02. \quad \text{Formula (2)}$$

4. A unidirectional surface acoustic wave transducer for propagating surface acoustic waves in one direction, formed on a piezoelectric made of Lithium Tetraborate ($Li_2B_4O_7$) single crystals and comprising comb type metal electrodes mainly made of aluminum (Al) in a designated thickness H, said metal electrodes comprising:

a positive electrode having a plurality of first electrode fingers, each of which having a width of $\lambda/8$, where $\lambda$ represents a wavelength of the surface acoustic wave; and a negative electrode having a plurality of second electrode fingers, each of which having a width of $\lambda/8$, spaced from adjacent one of the first electrode fingers at a distance of $\lambda/4$, and formed on a side of thereof and a plurality of third electrode fingers, each of which having a designated width M, spaced from adjacent one of the first electrode fingers at a distance of $3\lambda/8$, and formed on the other side thereof, wherein a cutting angle on the piezoelectric substrate and a propagation direction of the surface acoustic wave on the piezoelectric substrate are in the range of $45°\pm1°$, $90°\pm1°$, and $90°\pm1°$ by Euler's angle, or in their equivalent range, and a relative electrode thickness $H/\lambda(\%)$ obtained by dividing the thickness H of the metal electrodes by the wavelength $\lambda$ of the surface acoustic wave is in the range of 1% to 2%, and a relative electrode finger width $M/\lambda$ obtained by dividing the width M of the third electrode fingers by the wavelength $\lambda$ of the surface acoustic wave is in the range of 0.26 to 0.33.

* * * * *